(12) United States Patent
Chang et al.

(10) Patent No.: US 8,357,452 B2
(45) Date of Patent: Jan. 22, 2013

(54) ARTICLE AND METHOD FOR MANUFACTURING SAME

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW); Juan Zhang, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 77 days.

(21) Appl. No.: 13/010,975

(22) Filed: Jan. 21, 2011

(65) Prior Publication Data

US 2012/0052291 A1 Mar. 1, 2012

(30) Foreign Application Priority Data

Aug. 26, 2010 (CN) .......................... 2010 1 0263707

(51) Int. Cl.
*B32B 9/04* (2006.01)
*B32B 17/06* (2006.01)
*B32B 15/04* (2006.01)
*G11B 11/105* (2006.01)

(52) U.S. Cl. ..................... 428/411.1; 428/332; 428/426; 428/457; 204/192.1; 204/192.15

(58) Field of Classification Search ........................ None
See application file for complete search history.

(56) References Cited

U.S. PATENT DOCUMENTS

2001/0028962 A1\* 10/2001 Hirai .............................. 428/690
2006/0182883 A1\* 8/2006 Neogi et al. .................. 427/240

\* cited by examiner

*Primary Examiner* — Sheeba Ahmed
(74) *Attorney, Agent, or Firm* — Altis Law Group, Inc.

(57) ABSTRACT

An article includes a substrate; and a color layer deposited on the substrate, wherein the color layer is a chromium oxide-carbon layer; the color layer has an L* value between about 28 to about 32, an a* value between about −1 to about 1, and a b* value between about −1 to about 1 in the CIE L*a*b* color space.

12 Claims, 2 Drawing Sheets

ARTICLE AND METHOD FOR MANUFACTURING SAME

CROSS-REFERENCE TO RELATED APPLICATIONS

The present application is related to co-pending U.S. patent application Ser. Nos. 13/010,947, 13/010,957 and 13/010,963, entitled "ARTICLE AND METHOD FOR MANUFACTURING SAME", by Zhang et al. These applications have the same assignee as the present application and have been concurrently filed herewith. The above-identified applications are incorporated herein by reference.

BACKGROUND

1. Technical Field

The exemplary disclosure generally relates to articles and methods for manufacturing the articles.

2. Description of Related Art

Vacuum deposition is used to form a thin film or coating on housings of portable electronic devices, to improve abrasion resistance. However, typical vacuum deposition can not deposit absolute black coatings on the housing.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary embodiment of an article and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
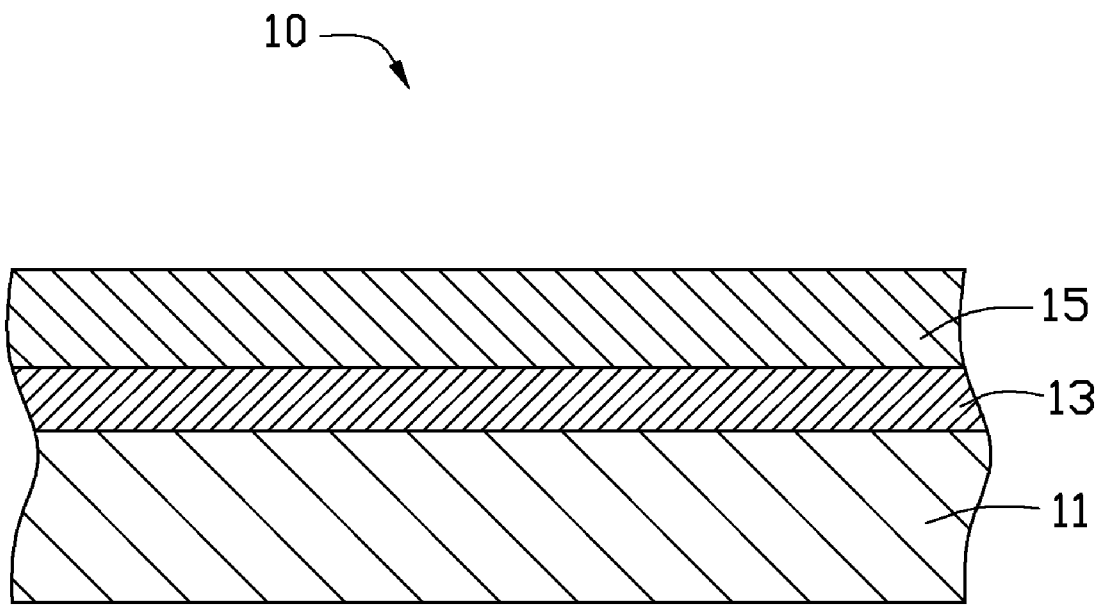
FIG. 1 illustrates a cross-sectional view of an exemplary embodiment of an article.
Figure 2:
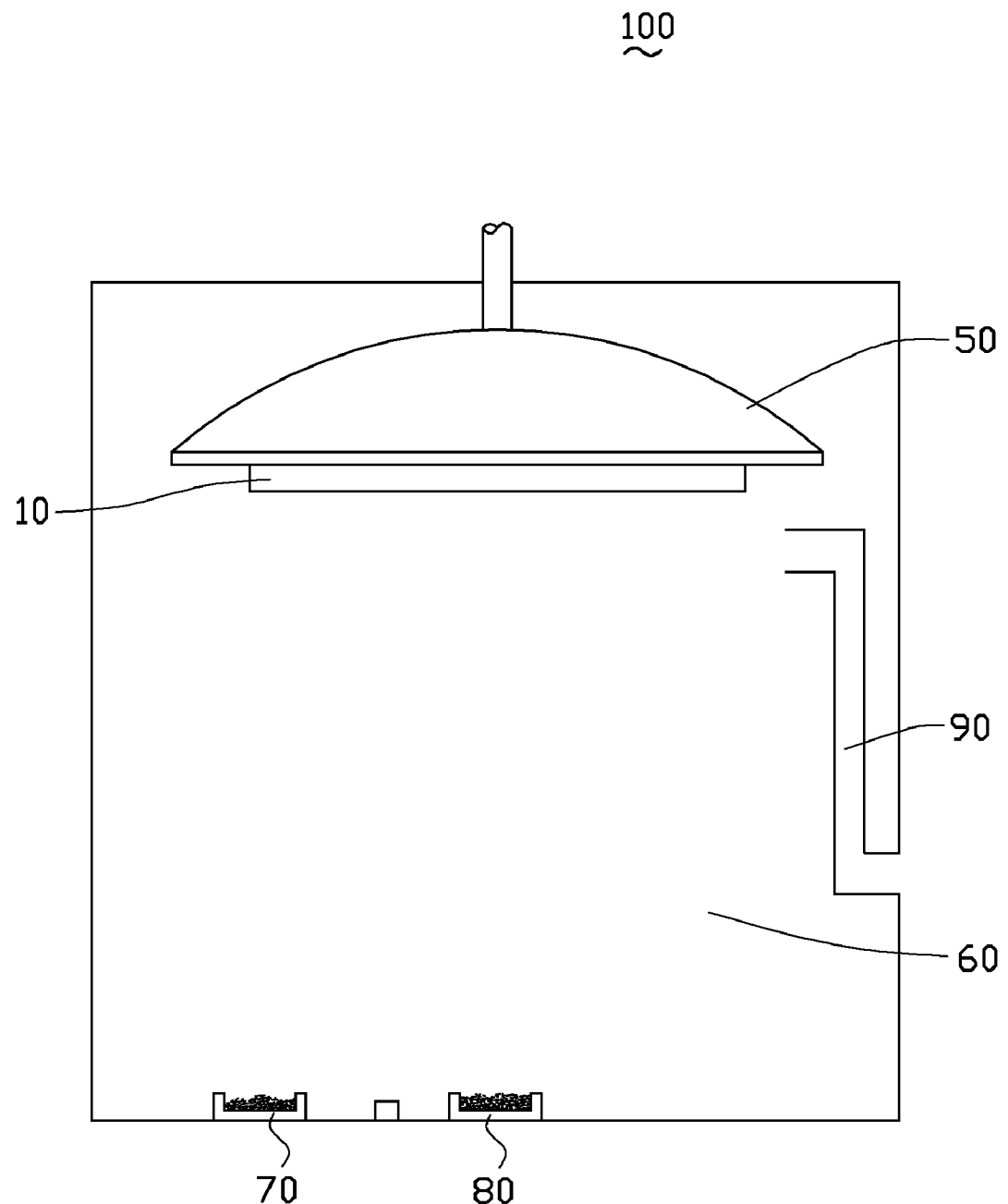
FIG. 2 is a schematic view of a magnetron sputtering coating machine for manufacturing the article in FIG. 1.

Referring to FIG. 1, an exemplary embodiment of an article 10 manufactured, by a coating process, such as by vacuum deposition, and includes a substrate 11, a bonding layer 13 deposited on the substrate 11 and a color layer 15 deposited on the bonding layer 13 opposite to the substrate 11. The article 10 may be a housing of an electronic device. The substrate 11 may be made of metal, glass, plastic or ceramic.

The bonding layer 13 is formed between the substrate 11 and the color layer 15 for improving the binding force between the substrate 11 and the color layer 15. The bonding layer 13 may be made of chromium. The bonding layer 13 has a thickness ranging from about 0.01 micrometers to about 0.1 micrometers, and in this exemplary embodiment has a thickness of about 0.05 micrometers. The bonding layer 13 in this exemplary embodiment has a color that does not affect the color of the color layer 15, such as silver, white, or gray.

The color layer 15 is a chromium oxide-carbon layer. The color layer 15 has an L* value between about 28 to about 32, an a* value between about −1 to about 1, and a b* value between about −1 to about 1 in the CIE L*a*b* (CIE LAB) color space, so the color layer 15 is absolute black. The color layer 15 has a thickness ranging from about 0.3 micrometers to about 1 micrometers.

A method for manufacturing the article 10 manufactured by vacuum deposition may include at least the following steps.

A substrate 11 is provided. The substrate 11 may be made of metal, glass, plastic or ceramic.

The substrate 11 is pretreated. For example, the substrate 11 may be washed with a solution (e.g., alcohol or acetone) in an ultrasonic cleaner, to remove, e.g., grease, dirt, and/or impurities. The substrate 11 is then dried. The substrate 11 may also be cleaned using argon plasma cleaning. The substrate 11 is retained on a rotating bracket 50 in a vacuum chamber 60 of a magnetron sputtering coating machine 100. The vacuum level of the vacuum chamber 60 is adjusted to 8.0×10-3 Pa. Pure argon is fed into the vacuum chamber 60 at a flux of about 300 Standard Cubic Centimeters per Minute (sccm) to 600 sccm from a gas inlet 90. A bias voltage is applied to the substrate 11 in a range from −300 to −800 volts for about 5 to about 10 min. The substrate 11 may then be washed by argon plasma, to further remove any contaminants. Thus, the binding force between the substrate 11 and the color layer 15 is enhanced.

The bonding layer 13 is deposited on the substrate 11 by magnetron sputtering. The temperature in the vacuum chamber 60 is adjusted to be in a range from 50 degrees Celsius (° C.) to 180° C., i.e., the reaction temperature is about 50° C. to about 180° C.; argon is fed into the vacuum chamber 60 at a flux from about 10 sccm to about 200 sccm from the gas inlet 90. The substrate 11 is rotated in a range from 1 revolution per minute (rpm) to 4 rpm. A chromium target 70 in the vacuum chamber 60 is evaporated at a power from about 5 kW to about 11 kW and a bias voltage is applied to the substrate 11 in a range from about −50 to about −200 volts for about 3 min to about 10 min, to deposit the bonding layer 13 on the substrate 11.

The color layer 15 is deposited on the bonding layer 13 by magnetron sputtering. The temperature in the vacuum chamber 60 is kept between about 50° C. to about 180° C., i.e., the reaction temperature is about 50° C. to about 180° C. Argon is continuously fed into the vacuum chamber 60 at a flux from about 10 sccm to about 200 sccm from the gas inlet 90. Oxygen is fed into the vacuum at a flux from 10 sccm to 50 sccm from the gas inlet 90, i.e, the reaction gas for depositing the color layer 15 is oxygen. The substrate 11 is rotated in a range from about 1 rpm to about 4 rpm. A chromium carbon alloy target 80 in the vacuum chamber 60 is evaporated at a power from about 5 kW to about 11 kW. A bias voltage is applied to the substrate 11 is in a range from about −50 volts to about −200 volts for about 10 min to about 60 min, to deposit the color layer 15 on the bonding layer 13. The chromium carbon alloy target contains atomic chromium in a range from about 50 to about 80 wt %, and in this exemplary embodiment is about 70 wt %.

The color layer 15 is absolute black which has an L* value between about 28 to about 32, an a* value between about −1 to about 1, and a b* value between about −1 to about 1 in the CIE L*a*b* (CIE LAB) color space.

In this exemplary embodiment, only one chromium carbon alloy target 80 is evaporated to deposit the color layer 15, rather than evaporating two separate targets, such as a separate chromium target and a separate carbon target. So the chromium atom and the carbon atom can be simultaneously deposited on the substrate 11 when the chromium carbon alloy target 80 is evaporated. Additionally, the composition of the color layer 15 can be changed by adjusting the flux of the reaction gas, i.e., adjusting the flux of oxygen, to ensure the color of the color layer 15 having an L* value between about 28 to about 32, an a* value between about −1 to about 1, and a b* value between about −1 to about 1 in the CIE L*a*b* (CIE LAB) color space, thereby an absolute black colored article 10 is produced. Furthermore, only evaporating one chromium carbon alloy target also can prevent two separate targets from polluting each other.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
    a substrate; and
    a color layer deposited on the substrate, wherein the color layer is a chromium oxide-carbon layer; the color layer has an L* value between about 28 to about 32, an a* value between about −1 to about 1, and a b* value between about −1 to about 1 in the CIE L*a*b* color space.

2. The article as claimed in claim 1, wherein the color layer has a thickness ranging from about 0.3 micrometers to about 1 micrometers.

3. The article as claimed in claim 1, wherein the substrate is made of metal, glass, plastic or ceramic.

4. The article as claimed in claim 1, further comprising a bonding layer formed between the substrate and the color layer for improving the binding force between the substrate and the color layer.

5. The article as claimed in claim 4, wherein the bonding layer is made of chromium.

6. The article as claimed in claim 5, wherein the bonding layer has a thickness ranging from about 0.01 micrometers to about 0.1 micrometers.

7. A method for manufacturing a article comprising steps of:
    providing a substrate; and
    depositing a color layer on the substrate by magnetron sputtering, wherein the substrate is retained in a vacuum chamber, the temperature in the vacuum chamber is kept between about 50° C. to about 180° C., argon is fed into the vacuum chamber at a flux from about 10 sccm to about 200 sccm, oxygen is fed into the vacuum at a flux from 10 sccm to 50 sccm, a chromium carbon alloy target in the vacuum chamber is evaporated at a power from about 5 kW to about 11 kW; a bias voltage is applied to the substrate is in a range from about −50 volts to about −200 volts for about 10 min to about 60 min, to deposit the color layer on the substrate.

8. The method of claim 7, wherein the chromium atomic carbon alloy target contains atomic chromium in a range from about 50 to about 80 wt %.

9. The method of claim 7, wherein the atomic chromium content in chromium carbon alloy target is about 70 wt %.

10. The method of claim 7, wherein the color layer has an L* value between about 28 to about 32, an a* value between about −1 to about 1, and a b* value between about −1 to about 1 in the CIE L*a*b* color space.

11. The method of claim 7, wherein the color layer is a chromium oxide-carbon layer.

12. The method of claim 7, wherein further including a step of depositing a bonding layer on the substrate by magnetron sputtering before depositing the color layer on the substrate, wherein during depositing the bonding layer, the temperature in the vacuum chamber is adjusted in a range from 50° C. to 180° C., argon is fed into the vacuum chamber at a flux from about 10 sccm to about 200 sccm, a chromium target in the vacuum chamber is evaporated at a power from about 5 kW to about 11 kW and a bias voltage is applied to the substrate in a range from about −50 volts to about −200 volts for about 3 min to about 10 min, to deposit the bonding layer on the substrate.

\* \* \* \* \*